(12) United States Patent
Ohnishi et al.

(10) Patent No.: US 7,928,802 B2
(45) Date of Patent: Apr. 19, 2011

(54) RF AMPLIFICATION DEVICE

(75) Inventors: Masami Ohnishi, Hachioji (JP); Satoshi Tanaka, Kokubunji (JP); Ryouichi Tanaka, Kokubunji (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/524,970

(22) PCT Filed: Dec. 19, 2007

(86) PCT No.: PCT/JP2007/074387
§ 371 (c)(1),
(2), (4) Date: Aug. 31, 2009

(87) PCT Pub. No.: WO2008/093477
PCT Pub. Date: Aug. 7, 2008

(65) Prior Publication Data
US 2010/0090767 A1   Apr. 15, 2010

(30) Foreign Application Priority Data

Jan. 30, 2007   (JP) .................................. 2007-019129

(51) Int. Cl.
*H03F 3/60* (2006.01)
(52) U.S. Cl. ........................................ 330/286; 330/310
(58) Field of Classification Search .................. 330/286, 330/302, 310, 98, 150
See application file for complete search history.

(56) References Cited

U.S. PATENT DOCUMENTS 4,559,503 A * 12/1985 Camand et al. ............... 330/302
(Continued)

FOREIGN PATENT DOCUMENTS

EP          1 612 932 A1     1/2006
(Continued)

OTHER PUBLICATIONS

I. J. Bahl, Broadband and Compact Impedance Transformers for Microwave Circuits, IEEE Microwave Magazine, pp. 56, 58-60 and 62, Aug. 2006.

(Continued)

*Primary Examiner* — Henry K Choe
(74) *Attorney, Agent, or Firm* — Mattingly & Malur, P.C.

(57) ABSTRACT

An RF amplification device has amplification elements which amplify a radio frequency input signal in wireless radio communication. Transmission line transformers are coupled to one of an input electrode and an output electrode of the amplification elements and have a main line Lout arranged between the input and the output, and a sub line Lin1 arranged between an AC ground point and one of the input and the output and coupled to the main line Lout. By applying an operating voltage different from the ground voltage level to the AC ground point, the operating voltage is supplied to the output electrodes of the amplification elements via the sub line from the AC ground point. In realizing a high-performance load circuit in an RF amplification device, it is possible to avoid increase of a module height of an RF module.

27 Claims, 7 Drawing Sheets

U.S. PATENT DOCUMENTS

| | | | |
|---|---|---|---|
| 4,591,802 A * | 5/1986 | Asazawa | 330/277 |
| 5,373,251 A * | 12/1994 | Kunitomo et al. | 330/279 |
| 5,574,402 A | 11/1996 | Nakajima et al. | |
| 6,463,267 B1 | 10/2002 | Akamine et al. | |
| 6,658,243 B2 | 12/2003 | Akamine et al. | |
| 7,368,997 B2 * | 5/2008 | Suzuki | 330/302 |
| 7,567,128 B2 * | 7/2009 | Oka et al. | 330/302 |
| 7,612,616 B2 * | 11/2009 | Deng et al. | 330/302 |
| 2002/0183029 A1 | 12/2002 | Akamine et al. | |
| 2005/0030107 A1 | 2/2005 | Shimizu et al. | |

FOREIGN PATENT DOCUMENTS

| | | |
|---|---|---|
| JP | 8-88523 A | 4/1996 |
| JP | 11-41042 A | 2/1999 |
| JP | 2000-244264 A | 9/2000 |
| JP | 2001-7657 A | 1/2001 |
| JP | 2001-217659 A | 8/2001 |
| JP | 2007-6450 A | 1/2007 |
| WO | 02/073794 A2 | 9/2002 |

OTHER PUBLICATIONS

J. Horn et al., Integrated Transmission Line Transformer, 2004 IEEE MTT-S Digest, pp. 201-204, 2004.

B. Toole et al., A Low Voltage, Low Power RF CMOS LNA for Bluetooth Applications using Transmission Line Transformers, Proceedings of the 27th European Solid-State Circuits Conference, 2001, ESSCIRC, 18-20 Sep. 2001, pp. 433-436.

O. Pitzalis Jr. et al., Broadband 60-W HF Linear Amplifier, IEEE Journel of Solid-State Circuits, vol. SC-6, No. 3, Jun. 1971, pp. 93-103.

B. E. Klehn et al., An Exact Analysis of Class-E Power Amplifiers for RF Communications, Proceedings of the 2004 International Symposium of Circuits and Systems, pp. 277-280.

\* cited by examiner

RF AMPLIFICATION DEVICE

TECHNICAL FIELD

The present invention relates to an RF (radio frequency) amplification device, in particular, to technique which is useful for avoiding increase of a module height of an RF module, and at the same time, for avoiding increase of an occupied area of a load circuit of a high-frequency amplifier formed over a semiconductor chip or a multilayer wiring circuit substrate.

BACKGROUND ART

Plural communication modes exist in mobile communications represented by a mobile-phone. For example in Europe, in addition to GSM which has been in widespread use as the second generation wireless communication system, and EDGE which has enhanced a data transmission speed of GSM, there is W-CDMA of which the service has started in recent years as the third generation wireless communication system. In North America, in addition to DCS and PCS which are the second generation wireless communication systems, cdma1× has been in widespread use as the third generation wireless communication system. GSM stands for Global System for Mobile Communications, EDGE stands for Enhanced Data rate for GSM Evolution, W-CDMA stands for Wideband Code Division Multiple Access, DCS stands for Digital Cellar System, PCS stands for Personal Communication System, and cdma1× stands for Code Division Multiple Access 1×.

Non Patent Literature 1 in the following describes that matching technique by a transmission line transformer (TLT) is employed for multi-octave impedance conversion at an RF frequency and a low-end microwave. Traditionally, in a power amplifier, in order to realize a transformer which converts a super low impedance into 50Ω in a band of an octave or beyond, a lot of inductors, capacitors, transmission lines, or combination of them are generally used in a ladder circuit. The traditional technique which uses these component parts results in a restricted frequency band and a large circuit size. A transmission line transformer (TLT) which uses a section of straight lines or coils of the transmission lines, coupled with each other, results in a wide band and a small circuit size. Non Patent Literature 1 in the following also describes that the present type of transformer can be designed to employ multilayer wiring manufacturing technology of, for example, a wiring circuit substrate, a low temperature co-fired ceramics (LTCC), a high temperature co-fired ceramics (HTCC), a monolithic silicon (Si), or a gallium arsenide (GaAs) IC.

Non Patent Literature 2 in the following introduces a Guanella-type and a Ruthroff-type transmission line transformer (TLT), and describes that an unbalanced Guanella type transmission line transformer (TLT) is formed by using a three-layer wiring over a GaAs substrate.

Non Patent Literature 3 in the following describes that a transmission line transformer (TLT) is different in that energy is transferred to an output circuit by a transmission line mode, in contrast with the traditional transformer in which energy is transferred by magnetic flux coupling. Since stray inductance and parasitic capacitance are generally absorbed by characteristic impedance of a transmission line, the transmission line transformer (TLT) is supposed to exhibit a broader bandwidth and a higher efficiency than the traditional transformer as a result. An off-chip transmission line transformer (TLT) is used for conversion of a single-ended signal to a differential signal and its inverse conversion in a low noise amplifier (LNA) for 2.4 GHz Bluetooth application.

Non Patent Literature 4 in the following describes that a transformer is a useful component for impedance matching, however, consideration must be taken into internal wiring capacitance in a frequency band of 2-30 MHz, and that a Guanella-type and a Ruthroff-type transmission line transformer (TLT) are, on the contrary, useful at a tremendously high electric power level, and are simply configured, inexpensive, light-weighted, and can treat a broad bandwidth. In a wide-band high-output RF linear amplifier of a frequency band of 2-30 MHz used for SSB and AM communication, a transmission line transformer (TLT) wound around a ferrite toroid is used for a matching circuit of an interstage and an output of a multistage amplifier.

Non Patent Literature 5 in the following describes the use of a choke coil inductance as a load of a power amplifier for RF communications for which a high efficiency is required. Non Patent Literature 5 in the following also describes that the choke coil inductance suppresses higher harmonics of current supplied from a DC power supply to an amplifier.

[Non Patent Literature 1] Inder J. Bahl; "Broadband and Compact Impedance Transformers for Microwave Circuits", IEEE MICROWAVE magazine, PP. 56-62, August 2006.

[Non Patent Literature 2] J. Horn et al; "Integrated Transmission Line Transformer", 2004 IEEE MTT-S Digest, PP. 201-204.

[Non Patent Literature 3] Bill Toole et al; "A Low Voltage, Low Power RF CMOS LNA for Bluetooth Applications using Transmission Line Transformers", Proceedings of the 27th European Solid-State Circuits Conference, 2001, ESSCIRC, 18-20 Sep., 2001, PP. 433-436.

[Non Patent Literature 4] OCTAVIUS PITZALIS et al; "Broadband 60-W HF Linear Amplifier", IEEE JOURNAL OF SOLID-STATE CIRCUITS, VOL. SC-6, NO. 3, JUNE 1971, PP. 93-103.

[Non Patent Literature 5] Brett E. Klehn et al; "AN EXACT ANALYSIS OF CLASS-E POWER AMPLIFIERS FOR RF COMMUNICATIONS", Proceedings of the 2004 International Symposium on Circuits and Systems, PP. 277-280.

DISCLOSURE OF THE INVENTION

Problems to be Solved by the Invention

A choke coil inductance is used as a load of an RF power amplifier as described in Non Patent Literature 5. The present inventors were engaged in the development of an RF module having an RF power amplifier built-in, in advance of the present invention.

FIG. 1 is a circuit diagram illustrating an RF module with a built-in RF power amplifier, developed by the present inventors in advance of the present invention. As illustrated in the figure, the RF power amplification device is configured as an RF power module RF_PAM built in one package.

From an integrated circuit for processing RF transmitting and receiving analog signals (henceforth called RF IC) mounted in a communication terminal apparatus such as a mobile-phone terminal, a first RF transmission input signal Pin_LB with a first frequency band of about 0.8 GHz-1.0 GHz of GSM850 and GSM900, and a second RF transmission input signal Pin_HB with a second frequency band of about 1.7 GHz-2.0 GHz of DCS1800, PCS1900, and WCDMA1900 are supplied to a first RF power amplifier HPA1 and a second RF power amplifier HPA2 of the RF power module RF_PAM, respectively.

An RF transmission signal of a band of GSM850 and an RF transmission signal of a band of GSM900 are supplied to an input of the first RF power amplifier HPA1, as the first RF transmission input signal Pin_LB with the first frequency band. The frequency band of the RF transmission signal of the band of GSM850 is 824 MHz-849 MHz, and the frequency band of the RF transmission signal of the band of GSM900 is 880 MHz-915 MHz.

An RF transmission signal of the band of DCS1800 and an RF transmission signal of the band of PCS1900 are supplied to an input of the second RF power amplifier HPA2, as the second RF transmission input signal Pin_HB with the second frequency band. An RF transmission signal of the band of WCDMA1900 can also be supplied to the input of the second RF power amplifier HPA2 as the second RF transmission input signal Pin_HB. The frequency band of the RF transmission signal of the band of DCS1800 is 1710 MHz-1785 MHz, the frequency band of the RF transmission signal of the band of PCS1900 is 1850 MHz-1910 MHz, and the frequency band of the RF transmission signal of the band of WCDMA1900 is 1920 MHz-1980 MHz.

In the first RF power amplifier HPA1, the first RF transmission input signal Pin_LB is supplied via a coupling capacitor C11, and amplified by an RF amplification element Q11 of an input amplifier 1st_Stg_LB of a multistage amplifier. An RF amplification signal from the input amplifier 1st_Stg_LB is supplied via an interstage matching circuit comprised of a harmonic trap circuit HTC and a coupling capacitor C12, and amplified by an RF amplification element Q12 of an output amplifier 2nd_Stg_LB of the multistage amplifier. A first RF transmission output signal Pout_LB is obtained from an output of the RF amplification element Q12. An operation power voltage Vdd is supplied to an output electrode of the RF amplification element Q11 of the input amplifier 1st_Stg_LB via an inductor L11 serving as a part of a load circuit, and to an output electrode of the RF amplification element Q12 of the output amplifier 2nd_Stg_LB via an inductor L12 serving as a part of a load circuit. A bias voltage created by an input bias circuit 1st_BC_LB is supplied to an input electrode of the RF amplification element Q11 of the input amplifier 1st_Stg_LB. A bias voltage created by an output bias circuit 2nd_BC_LB is supplied to an input electrode of the RF amplification element Q12 of the output amplifier 2nd_Stg_LB.

In the RF power amplification device RF_PAM illustrated in FIG. 1, the harmonic trap circuit HTC comprised of an inductor L101 and a capacitor C101 is coupled to a drain of a source-grounded N-MOS Q11 of the input amplifier 1st_Stg_LB of the first RF power amplifier HPA1 for GSM850 and GSM900. The harmonic trap circuit HTC functions also as an interstage matching circuit. A series resonance frequency of the inductor L101 and the capacitor C101 of the harmonic trap circuit HTC is set up so as to roughly resonate at a second harmonic frequency (1700 MHz-1800 MHz) of the frequency of the RF transmission input signal RFPin_LB of GSM850 and GSM900. As a result, the second harmonic at the drain of the source-grounded N-MOS Q11 of the first RF power amplifier HPA1 is bypassed to a ground potential point via a very low series resonance impedance of the inductor L101 and the capacitor C101 of the harmonic trap circuit HTC. The harmonic trap circuit HTC coupled to the drain of the source-grounded N-MOS Q11 of the first RF power amplifier HPA1 reduces influence of the second harmonic of the frequency of the RF transmission input signal RFPin_LB of GSM850 and GSM900, acting as a disturbance signal against an N-MOS Q21 and an N-MOS Q22 of the second RF power amplifier HPA2 which amplifies the RF transmission input signal RFPin_HB of DCS1800 and PCS1900.

In the second RF power amplifier HPA2, the second RF transmission input signal Pin_HB is supplied via a coupling capacitor C21, and amplified by an RF amplification element Q21 of the input amplifier 1st_Stg_HB of a multistage amplifier. An RF amplification signal from the input amplifier 1st_Stg_HB is supplied via an interstage matching circuit comprised of a coupling capacitor C22, and amplified by an RF amplification element Q22 of the output amplifier 2nd_Stg_HB of the multistage amplifier. A second RF transmission output signal Pout_HB is obtained from an output of the RF amplification element Q22. The operation power voltage Vdd is supplied to an output electrode of the RF amplification element Q21 of the input amplifier 1st_Stg_HB via an inductor L21 serving as a part of a load circuit, and to an output electrode of the RF amplification element Q22 of the output amplifier 2nd_Stg_HB via an inductor L22 serving as a part of a load circuit. A bias voltage created by an input bias circuit 1st_BC_HB is supplied to an input electrode of the RF amplification element Q21 of the input amplifier 1st_Stg_HB. A bias voltage created by an output bias circuit 2nd_BC_HB is supplied to an input electrode of the RF amplification element Q22 of the output amplifier 2nd_Stg_HB.

The inductors L11, L12, L21, L22, which are respectively a part of the load circuit and act as a bias supplying part, and the inductor L101 of the harmonic trap circuit HTC can be formed by an air-core coil which is a high-performance discrete part. However, there was a problem that the module height of the RF module is increased by the part height of the air-core coil. It is also possible to realize these inductors L11, L12, L2, L22, and L101, by a spiral coil formed by a wiring process of a semiconductor manufacturing process over a monolithic silicon (Si) or a gallium arsenide (GaAs) IC, or by a spiral coil formed by multilayer wiring over a multilayer wiring circuit substrate. A large current capacity and a high Q factor are required for the choke coil inductance L12 and L22 which serve as a part of a load circuit of the final stage of the RF power amplifier. However, in order to realize the large current capacity and the high Q factor, there was a problem that the occupied area of the spiral coil over the semiconductor chip or the multilayer wiring circuit substrate becomes very large.

The present invention has been made in view of the above circumstances and provides an RF amplification device, in which the increase of a module height of an RF module in realizing a high-performance load is avoided, and at the same time, the increase of an occupied area of a load circuit of a high-frequency amplifier formed over a semiconductor chip or a multilayer wiring circuit substrate is avoided.

The other purposes and the new feature of the present invention will become clear from the description of the present specification and the accompanying drawings.

Means for Solving the Problems

The following simply explains an outline of typical one of the inventions disclosed by the present application.

Namely, a typical RF amplification device according to an example of the present invention comprises an amplification element which amplifies a radio frequency input signal in wireless radio communication; and a transmission line transformer coupled to at least one electrode of an input electrode and an output electrode of the amplification element concerned. The transmission line transformer comprises a main line arranged between an input and an output and a sub line arranged between an AC ground point and one of the input and the output, and coupled to the main line. One of the input and the output of the main line of the transmission line transformer is coupled to the one electrode of the amplification element, and an operating voltage different from a ground voltage level is applied to the AC ground point, and the operating voltage is supplied to the one electrode of the amplification element from the AC ground point via the sub line.

As a result, in realizing a high-performance load in an RF amplification device, it is possible to avoid increase of a module height of an RF module, and at the same time, to avoid increase of an occupied area of a load circuit of a high-frequency amplifier which is formed over a semiconductor chip or a multilayer wiring circuit substrate.

The present inventors have reached a basic technical thought of the present invention in which a transmission line transformer is coupled to at least one electrode of an output electrode and an input electrode of an amplification element which amplifies a radio frequency input signal in wireless radio communication, and an operating voltage different from a ground voltage level is applied to an AC ground point of the transmission line transformer, accordingly, it is enabled to supply the operating voltage to one electrode of the amplification element from the AC ground point via the sub line. The first half of the technical thought of the present invention is known by Non Patent Literature 4 described above. However, in Non Patent Literature 4, an inductance different from the transmission line transformer is used as a load circuit of the output electrode of the amplification element. This point is different from the present invention. Moreover, in Non Patent Literature 4, the operating voltage different from the ground voltage level is not applied to the transmission line transformer; therefore, the second half of the basic technical thought of the present invention is lacking.

Effects of the Invention

The following explains briefly the effect acquired by the typical one of the inventions disclosed by the present application.

That is, according to the present invention, in realizing a high-performance load in an RF amplification device, it is possible to avoid increase of a module height of an RF module, and at the same time, to avoid increase of an occupied area of a load circuit of a high-frequency amplifier which is formed over a semiconductor chip or a multilayer wiring circuit substrate.

EXPLANATION OF REFERENCE

Figure 1:
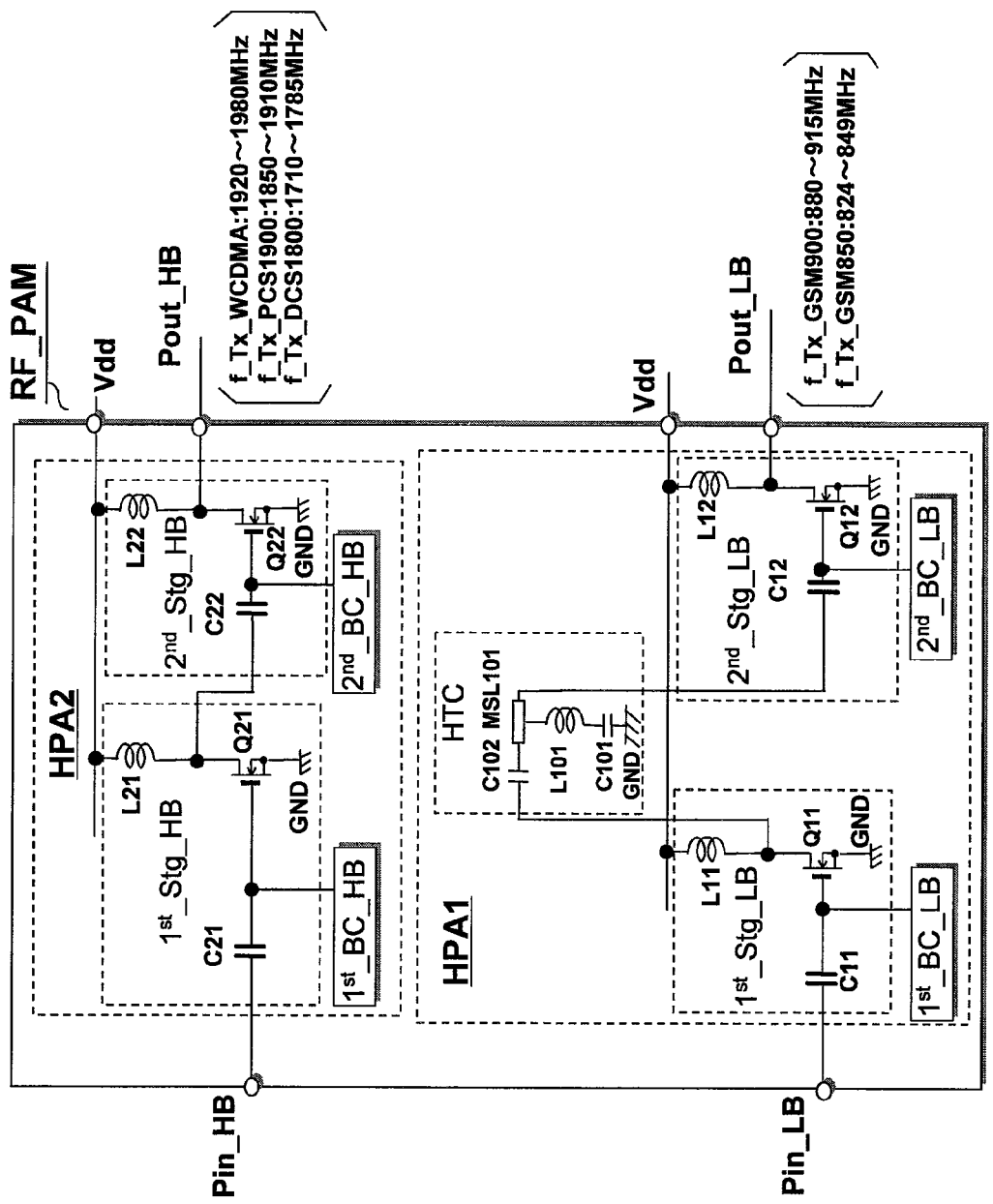
FIG. 1 is a circuit diagram illustrating an RF module with a built-in RF power amplifier, developed by the present inventors in advance of the present invention.

Pin_LB first RF transmission input signal
Pin_HB second RF transmission input signal
HPA1 first RF power amplifier
HPA2 second RF power amplifier
Q11, Q12, Q21, Q22 RF amplification element
TLT11, TLT12, TLT21, TLT22 transmission line transformer
Cin, Cout, Cpass capacitor
Pout_LB first RF transmission output signal
Pout_HB second RF transmission output signal
CPL_LB, CPL_HB coupler
MODE mode signal
1st_Stg_LB first input amplifier
2nd_Stg_LB first output amplifier
1st_BC_LB first input bias circuit
2nd_BC_LB first output bias circuit
1st_Stg_HB second input amplifier
2nd_Stg_HB second output amplifier
1st_BC_HB second input bias circuit
2nd_BC_HB second output bias circuit

BEST MODE FOR CARRYING OUT THE INVENTION

1. <<Typical Embodiment>>

First, an outline is explained on a typical embodiment of the invention disclosed in the present application. A numerical symbol in parentheses referring to a component of the drawing in the outline explanation about the typical embodiment only illustrates what is included in the concept of the component to which the numerical symbol is attached.

(1) An RF amplification device according to a typical embodiment of the present invention comprises an amplification element (Q12) which amplifies a radio frequency input signal in wireless radio communication, and a transmission line transformer (TLT12) coupled to at least one electrode of an input electrode and an output electrode of the amplification element concerned. The transmission line transformer comprises a main line (Lout) arranged between an input and an output and a sub line (Lin) arranged between an AC ground point and one of the input and the output, and coupled to the main line. One of the input and the output of the main line of the transmission line transformer is coupled to the one electrode of the amplification element. An operating voltage (Vdd) different from a ground voltage level is applied to the AC ground point, and the operating voltage is supplied to the one electrode of the amplification element from the AC ground point via the sub line (refer to FIG. 1).

According to the embodiment, a transmission line with a certain characteristic impedance is formed between the sub line and the main line of the transmission line transformer. Accordingly, energy is transferred from the sub line to the main line of the transmission line transformer by a transmission line mode. Accordingly, by the impedance conversion in a circuit comprised of the sub line and the main line of the transmission line transformer, it becomes possible to take out an RF amplification voltage signal from the output electrode of the amplification element, without employing an air-core coil as the inductor which is a part of the load circuit and a bias supplying part, or without employing a spiral coil or a choke coil inductance having a large current capacity and a high Q factor. As a result, in realizing a high-performance load in the RF amplification device, it is possible to avoid increase of a module height of the RF module, and at the same time, to avoid increase of an occupied area of the load circuit of a high-frequency amplifier which is formed over a semiconductor chip or a multilayer wiring circuit substrate.

As a preferred embodiment, in the RF amplification device, a capacitor (Cin, Cout, Cpass) is coupled between the input of the transmission line transformer and the ground potential, between the output of the transmission line transformer and the ground potential, or between the AC ground point of the sub line of the transmission line transformer and the ground potential. Owing to the capacitors coupled, the line length (Lx) of the transmission line transformer is set to a half of or less than a half of a quarter of the wavelength ($\lambda$) of an operating RF frequency (refer to FIG. 7).

Therefore, according to the preferred embodiment, it is possible to avoid increase of an occupied area of the high-performance load over a semiconductor chip or a multilayer wiring circuit substrate.

Figure 7:
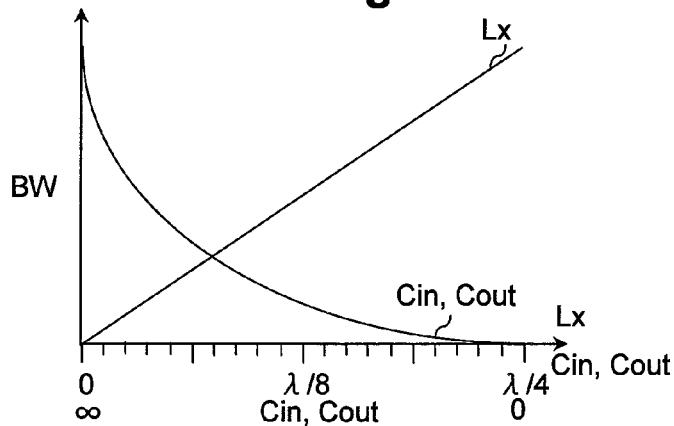
FIG. 7 is a drawing illustrating relationship between a line length Lx of the transmission line transformer and capacitors Cin and Cout illustrated in FIG. 3.

As a more preferred embodiment, by setting the line length of the transmission line transformer to a half of or less than a half of a quarter of the wavelength of the operating RF frequency, a frequency characteristic of the RF amplification device is set to have a narrower band than a band characteristic in the case of setting the line length of the transmission line transformer to a quarter of the wavelength of the operating RF frequency (refer to FIG. 7).

Therefore, according to the more preferred embodiment, it becomes possible to suppress generation of a higher harmonic signal from the RF amplification device.

Figure 3:
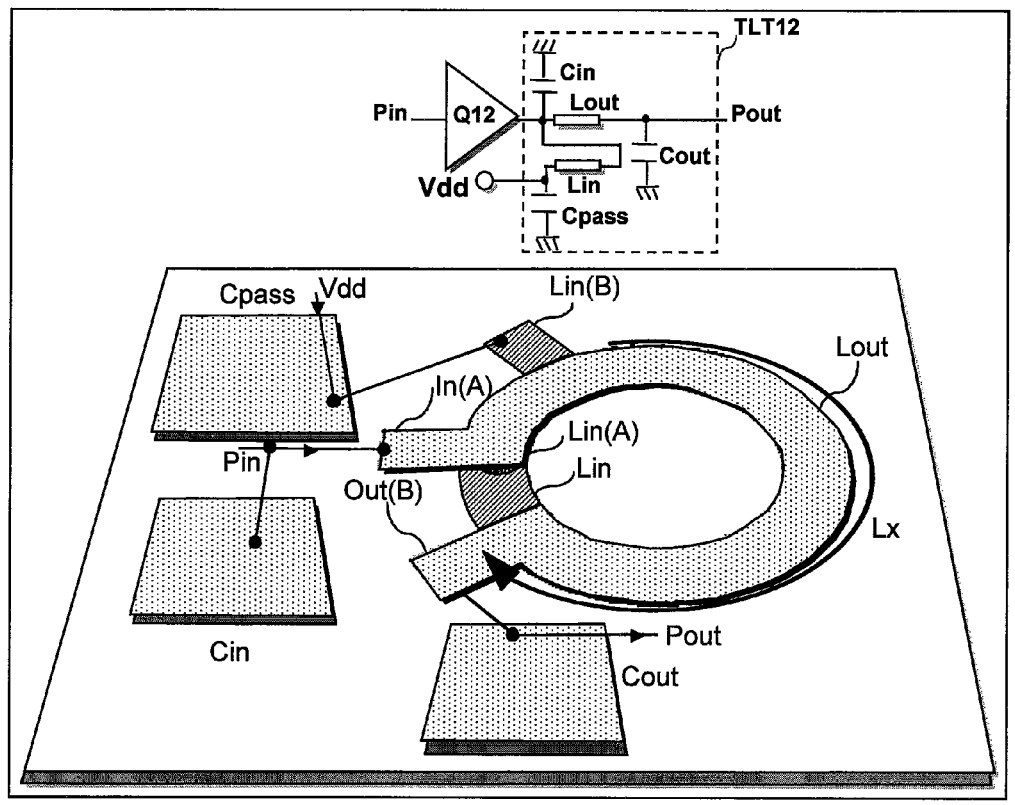
FIG. 3 is a drawing illustrating that a transmission line transformer with a main line and a sub line, illustrated in the lower right of FIG. 2, is formed by multilayer wiring over a semiconductor chip or a wiring substrate.
Figure 4:
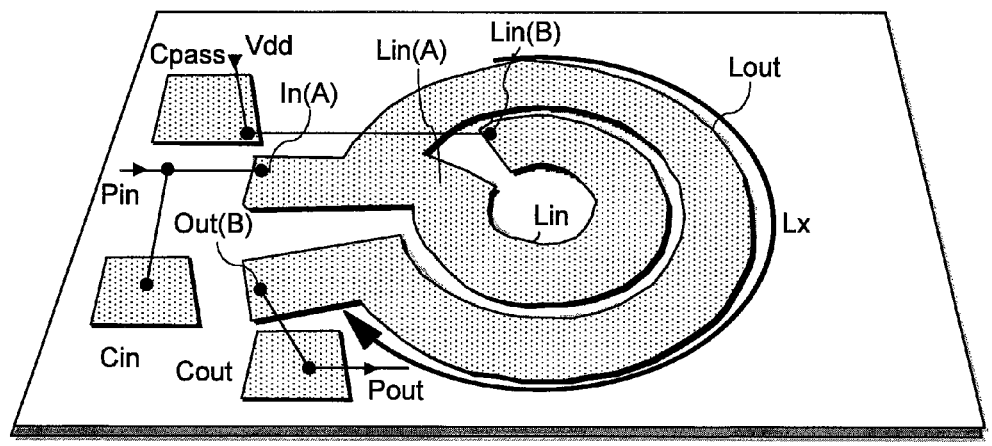
FIG. 4 is a drawing illustrating that a transmission line transformer with a main line and a sub line, illustrated in the lower right of FIG. 2, is formed by a one-layer wiring over a semiconductor chip or a wiring substrate.

As a more preferred embodiment, the main line and the sub line of the transmission line transformer are formed by a wiring layer arranged over a semiconductor chip or a wiring circuit substrate (refer to FIG. 3 and FIG. 4).

As a specific embodiment, the main line and the sub line of the transmission line transformer and one electrode and the other electrode of the capacitor are formed by multi wiring layers arranged over the semiconductor chip or the wiring circuit substrate (refer to FIG. 3).

Figure 2:
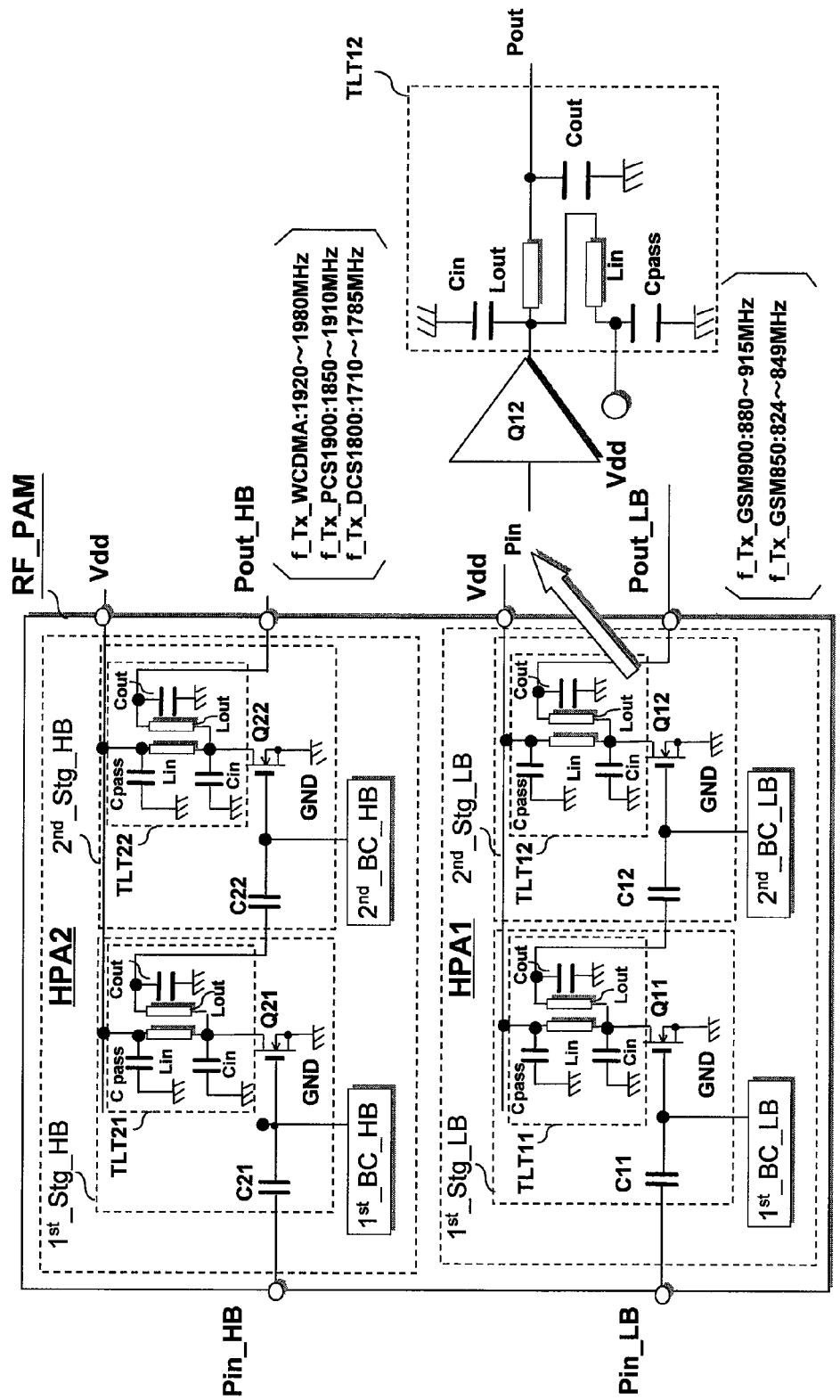
FIG. 2 is a circuit diagram illustrating an RF module with a built-in RF power amplifier, according to one embodiment of the present invention.

As another specific embodiment, the amplification element generates an RF transmission signal to be transmitted from an antenna of a wireless radio communication terminal, and the RF amplification device is a power amplifier (refer to FIG. 2).

Figure 12:
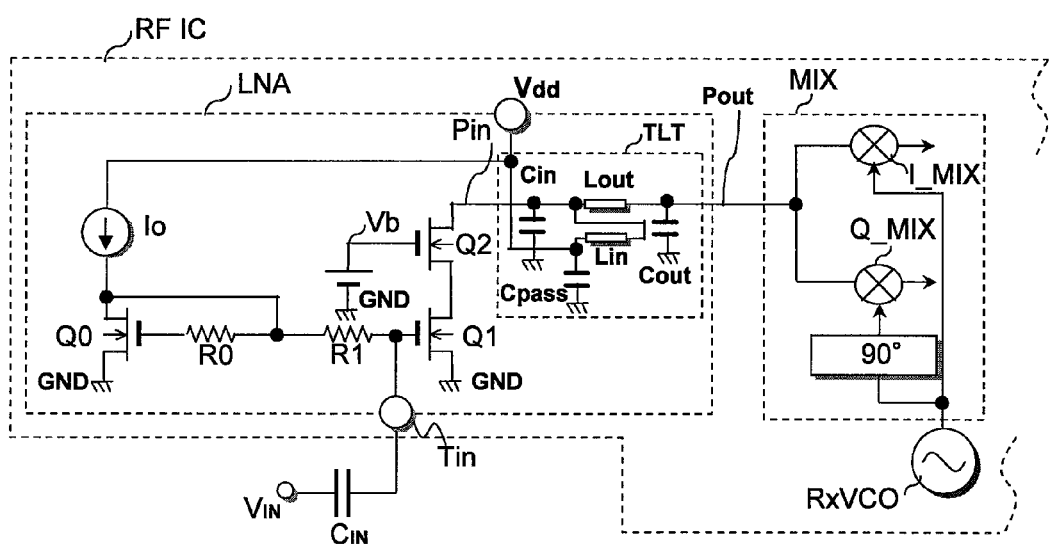
FIG. 12 is a drawing illustrating constitution of an RF IC according to yet another embodiment of the present invention.

As further another specific embodiment, the amplification element amplifies an RF reception signal received by an antenna of a wireless radio communication terminal, and the RF amplification device is a low-noise amplifier (LNA) (refer to FIG. 12).

(2) An RF amplification device (RF_PAM) according to another embodiment of the present invention comprises a first power amplifier (HPA1) which amplifies a first RF transmission input signal (Pin_LB) having a first frequency band, and a second power amplifier (HPA2) which amplifies a second RF transmission input signal (Pin_HB) having a second frequency band with a higher frequency than the first frequency band.

The first power amplifier is comprised of a first multistage amplifier comprising at least a first input amplifier (1st_Stg_LB) and a first output amplifier (2nd_Stg_LB)

The second power amplifier is comprised of a second multistage amplifier comprising at least a second input amplifier (1st_Stg_HB) and a second output amplifier (2nd_Stg_HB).

The first input amplifier of the first power amplifier comprises a first input amplification element (Q11) and a first input transmission line transformer (TLT11) coupled to an output electrode of the first input amplification element concerned. The first output amplifier of the first power amplifier comprises a first output amplification element (Q12) and a first output transmission line transformer (TLT12) coupled to an output electrode of the first output amplification element concerned. The second input amplifier of the second power amplifier comprises a second input amplification element (Q21) and a second input transmission line transformer (TLT21) coupled to an output electrode of the second input amplification element concerned. The second output amplifier of the second power amplifier comprises a second output amplification element (Q22) and a second output transmission line transformer (TLT22) coupled to an output electrode of the second output amplification element concerned.

Each of the first input transmission line transformer, the first output transmission line transformer, the second input transmission line transformer, and the second output transmission line transformer comprises a main line (Lout) arranged between an input (Pin) and an output (Pout), and a sub line (Lin) arranged between an AC ground point and one of the input and the output and coupled to the main line. The input of the main line of the each transmission line transformer is coupled to the output electrode of the corresponding amplification element. An operating voltage (Vdd) different from a ground voltage level is applied to the AC ground point, and the operating voltage is supplied to the output electrode of the amplification element from the AC ground point via the sub line (refer to FIG. 2).

As a result, in realizing a high-performance load in an RF amplification device (RF_PAM), it is possible to avoid increase of a module height of an RF module, and at the same time, to avoid increase of an occupied area of a load circuit of a high-frequency amplifier which is formed over a semiconductor chip or a multilayer wiring circuit substrate.

Figure 5:
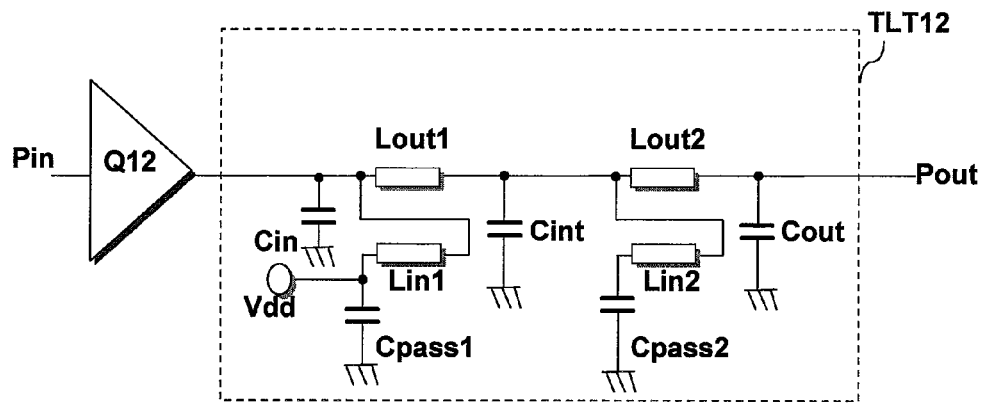
FIG. 5 is a drawing illustrating another example of constitution of the load circuit of the RF amplification element of the RF power amplifier according to one embodiment of the present invention illustrated in FIG. 2.

As a preferred embodiment, each of the first input transmission line transformer, the first output transmission line transformer, the second input transmission line transformer, and the second output transmission line transformer is a multistage-coupled transmission line transformer (Lout1, Lin1, Lout2, Lin2) (refer to FIG. 5).

As a preferred embodiment, in the RF amplification device, the line length of each transmission line transformer of the first input transmission line transformer, the first output transmission line transformer, the second input transmission line transformer, and the second output transmission line transformer, is set to a half of or less than a half of a quarter of the wavelength of an operating RF frequency, by providing a capacitor (Cin, Cout, Cpass) between the input of the each transmission line transformer and the ground potential, between the output of the each transmission line transformer and the ground potential, or between the AC ground point of the sub line of the each transmission line transformer and the ground potential (refer to FIG. 7).

Therefore, according to the preferred embodiment, it is possible to avoid increase of an occupied area of a load of a load circuit of a high-frequency amplifier which is formed over a semiconductor chip or a multilayer wiring circuit substrate.

As a more preferred embodiment, by setting the line length of the each transmission line transformer to half of or less than a half of a quarter of the wavelength of the operating RF frequency, a frequency characteristic of the RF amplification device is set to have a narrower band than a band characteristic in the case of setting the line length of the each transmission line transformer to a quarter of the wavelength of the operating RF frequency (refer to FIG. 7).

Therefore, according to the more preferred embodiment, it becomes possible to suppress generation of a higher harmonic signal from the RF amplification device.

As a more preferred embodiment, the main line and the sub line of each of the first input transmission line transformer, the first output transmission line transformer, the second input transmission line transformer, and the second output transmission line transformer are formed by a wiring layer arranged over a semiconductor chip or a wiring circuit substrate (refer to FIG. 3 and FIG. 4).

As a specific embodiment, the main line and the sub line of each of the first input transmission line transformer, the first output transmission line transformer, the second input transmission line transformer, and the second output transmission line transformer, and one electrode and the other electrode of the capacitor are formed by multi wiring layers arranged over the semiconductor chip or the wiring circuit substrate (refer to FIG. 3).

In an RF amplification device according to one preferred embodiment of the present invention, the first input amplification element, the second input amplification element, the first output amplification element, and the second output amplification element of the first power amplifier and the second power amplifier are a field-effect transistor.

In an RF amplification device according to one more preferred embodiment of the present invention, the field-effect transistor is LDMOS.

In an RF amplification device according to another preferred embodiment of the present invention, the first input amplification element and the first output amplification element of the first power amplifier and the second input amplification element and the second output amplification element of the second power amplifier are a bipolar transistor.

In an RF amplification device according to another more preferred embodiment of the present invention, the bipolar transistor is a heterojunction type.

Figure 10:
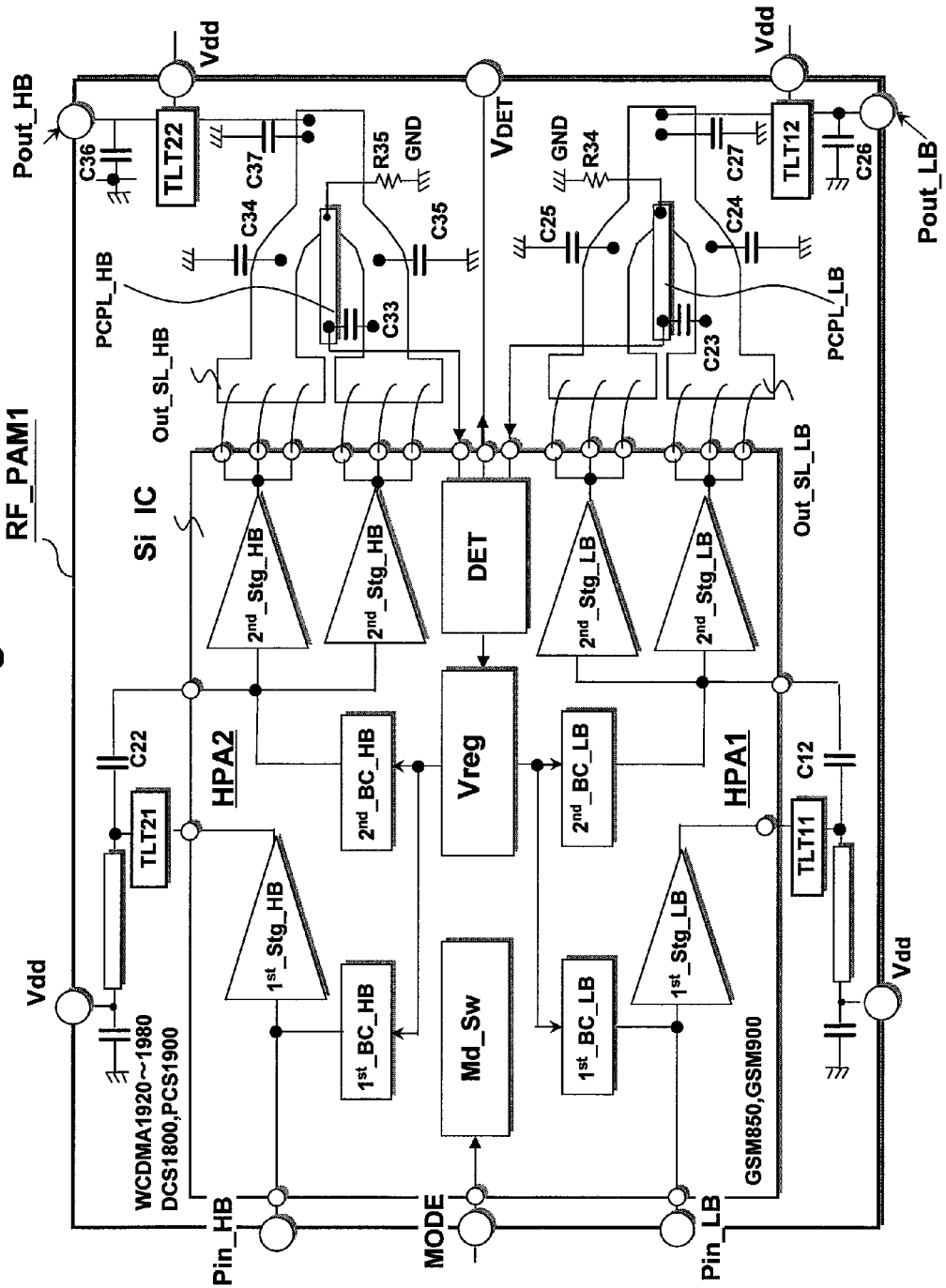
FIG. 10 is a drawing illustrating specific constitution of an RF power module RF_PAM according to further another embodiment of the present invention.

In an RF amplification device (RF_PAM) according to a specific embodiment of the present invention, the first power amplifier (HPA1), the second power amplifier (HPA2), and a power detector (DET) which detects a transmission output level of the first power amplifier (HPA1) and the second power amplifier (HPA2), are mounted in a package of an RF power module (refer to FIG. 10).

In an RF amplification device (RF_PAM) according to a specific embodiment of the present invention, the first RF transmission input signal (Pin_LB) is in a frequency band of at least one of GSM850 and GSM900, and the second RF transmission input signal (Pin_HB) is in a frequency band of at least one of DCS1800, PCS1900, and W-CDMA.

In an RF amplification device (RF_PAM) according to a specific embodiment of the present invention, the first output amplifier (2nd_Stg_LB) of the first power amplifier (HPA1) is comprised of plural first amplifiers coupled in parallel, and the second output amplifier (2nd_Stg_HB) of the second power amplifier (HPA2) is comprised of plural second amplifiers coupled in parallel (refer to FIG. 10).

(3) An RF amplification device (RF_PAM) according to further another embodiment of the present invention comprises an amplification element (Q12) which amplifies a radio frequency input signal of wireless radio communication, and a transmission line transformer (TLT12) coupled to an electrode of at least one of an input electrode and an output electrode of the amplification element concerned.

The transmission line transformer comprises a former-stage transmission line transformer comprising a first main line (Lout1) arranged between a first input and a first output, and a first sub line (Lint) arranged between a first AC ground point and one of the first input and the first output and coupled to the first main line. The transmission line transformer comprises a latter-stage transmission line transformer comprising a second main line (Lout2) arranged between a second input and a second output, and a second sub line (Lin2) arranged between a second AC ground point and one of the second input and the second output and coupled to the second main line.

The first output of the first main line (Lout1) of the former-stage transmission line transformer of the transmission line transformer is coupled to the second input of the second main line (Lout2) of the latter-stage transmission line transformer. One of the first input of the first main line (Lout1) of the former-stage transmission line transformer of the transmission line transformer and the second output of the second main line (Lout2) of the latter-stage transmission line transformer of the transmission line transformer is coupled to the one electrode of the amplification element (Q12). An operating voltage (Vdd) different from a ground voltage level is applied to one of the first AC ground point and the second AC ground point, and the operating voltage is supplied to the one electrode of the amplification element (refer to FIG. 5).

2. <<Explanation of Embodiments>>

Next, the embodiments are explained further in full detail. Hereafter, the best mode for practicing the present invention is explained in detail based on the accompanying drawings. In the entire diagrams for explaining the embodiments of the present invention, the same symbol is attached to a member which has the same function, and the repeated explanation thereof is omitted.

<<An RF Module According to One Embodiment of the Present Invention>>

FIG. 2 is a circuit diagram illustrating an RF module with a built-in RF power amplifier, according to one embodiment of the present invention. As illustrated in the figure, the RF power amplification device is configured as an RF power module RF_PAM built in one package.

When compared with the RF module illustrated in FIG. 1, developed by the present inventors in advance of the present invention, the RF module according to one embodiment of the present invention illustrated in FIG. 2 excludes the harmonic trap circuit HTC illustrated in FIG. 1. Load circuits of output electrodes of RF amplification elements Q11, Q12, Q21, Q22 are not a harmonic trap circuit HTC comprising a choke coil inductor as illustrated in FIG. 1, but are transmission line transformers TLT11, TLT12, TLT21, TLT22, respectively.

As a result, in FIG. 2, an air-core coil of which the part height poses a problem is not used, or a spiral inductor with a large occupied area in a monolithic IC or a wiring substrate is not used. The transmission line transformers TLT11, TLT12, TLT21, TLT22 of the load elements of the output electrodes of the RF amplification elements Q11, Q12, Q21, Q22 can be easily formed with wiring over a semiconductor chip of a monolithic IC, or over a wiring substrate.

As illustrated in the lower right of FIG. 2, the transmission line transformer TLT12 as the load circuit of the output electrode of the RF amplification element Q12 comprises a main line Lout arranged between an input and an output Pout, and a sub line Lin arranged between an AC ground point and either of the input and the output, and coupled to the main line Lout. The input of the main line Lout of the transmission line transformer TLT12 is coupled to the output electrode of the amplification element Q12. By applying an operating voltage Vdd different from the ground voltage level GND to the AC ground point of the sub line Lin, the operating voltage Vdd is supplied to the output electrode of the amplification element Q12 via the sub line Lin from the AC ground point. An input capacitor Cin and an output capacitor Cout are coupled to the input and the output of the main line Lout, respectively, and a bypass capacitor Cpass is coupled to the AC ground point of the sub line Lin.

FIG. 5 is a drawing illustrating another example of constitution of the load circuit of the RF amplification elements Q11, Q12, Q21, Q22 of the RF power amplifier according to one embodiment of the present invention illustrated in FIG. 2.

As illustrated in FIG. 5, the transmission line transformer TLT12 as the load circuit of the RF amplification element Q12 is comprised of a former-stage transmission line transformer Lout1, Lin1, and a latter-stage transmission line transformer Lout2 and Lin2. The former-stage transmission line transformer comprises a main line Lout1 arranged between the input and the output Pout, and a sub line Lin1 arranged between an AC ground point and either of the input and the output of the main line Lout1 and coupled to the main line Lout1. The latter-stage transmission line transformer comprises similarly a main lines Lout2 arranged between an input and an output Pout, and a sub line Lin2 arranged between an AC ground point and either of the input and the output of the main line Lout2, and coupled to the main line Lout2.

An input capacitor Cin and an interstage capacitor Cint are respectively coupled to the input and the output of the main line Lout1 of the former-stage transmission line transformer, and an output capacitor Cout is coupled to the output of the main line Lout2 of the latter-stage transmission line transformer. By coupling these capacitors Cin, Cint, and Cout to the main line Lout1 of the former-stage transmission line transformer, and to the main line Lout2 of the latter-stage transmission line transformer, the line length of the main lines Lout1 and Lout2 can be made shorter than a quarter of the wavelength of an operating RF frequency. As a result, the band can be set narrower than the band characteristic in the case when the line length is set to a quarter of the wavelength of the operating RF frequency, and the level of an undesirable out-of-band frequency signal can be suppressed.

Bypass capacitors Cpass1 and Cpass2 are coupled to the AC ground point of the sub line Lin1 of the former-stage transmission line transformer, and to the AC ground point of the sub line Lin2 of the latter-stage transmission line transformer, respectively. By applying an operating voltage Vdd different from the ground voltage level GND to the AC ground point of the sub line Lin1 of the former-stage transmission line transformer, the operating voltage Vdd is supplied to the output electrode of the amplification element Q12 via the sub line Lin1 from the AC ground point. The input of the main line Lout1 of the transmission line transformer TLT12 is coupled to the output electrode of the amplification element Q12. An amplified output Pout by the amplification element Q12 is obtained from the output of the main line Lout2 of the transmission line transformer TLT12.

The transmission line transformer TLT12 as the load circuit of the RF amplification element Q12, illustrated in FIG. 5, can improve greatly suppressing effect of an out-of-band frequency signal level by employing two-stage cascade connection as compared with one-stage constitution. By changing impedance conversion ratios by the former-stage transmission line transformer and the latter-stage transmission line transformer, it is possible to suppress an out-of-band frequency signal level and, at the same time, to obtain a wide band-pass characteristic, as compared with the one-stage constitution.

FIG. 3 is a drawing illustrating that the transmission line transformer TLT12 with the main line Lout and the sub line Lin, illustrated in the lower right of FIG. 2, is formed by multilayer wiring over a semiconductor chip or a wiring substrate. The sub line Lin of the transmission line transformer TLT12 is formed by a lower layer wiring of the multilayer wiring, and the main line Lout of the transmission line transformer TLT12 is formed by an upper-layer wiring of the multilayer wiring. The sub line Lin formed by the lower layer wiring of the multilayer wiring and the main line Lout formed by the upper-layer wiring of the multilayer wiring are electrically insulated by an interlayer insulation film. The operating voltage Vdd can be supplied to one end Lin(B) of the sub line Lin formed by the lower layer wiring of the multilayer wiring, and the input signal Pin from the output electrode of the amplification element Q12 can be supplied to the other end Lin(A) of the sub line Lin. The other end Lin(A) of the sub line Lin is coupled to the one end In (A) of the main line Lout of the transmission line transformer TLT12 through a via hole formed in the interlayer insulation film. The output power Pout of the amplification element Q12 can be generated from the other end Out (B) of the main line Lout, by the impedance conversion from the sub line Lin to the main line Lout of the transmission line transformer TLT12. That is, characteristic impedance is formed due to the interlayer insulation film between the sub line Lin and the main line Lout of the transmission line transformer TLT12. Therefore, energy is transferred from the sub line Lin to the main line Lout of the transmission line transformer TLT12, by a transmission line mode. Therefore, it becomes possible to take out an RF amplification voltage signal from the output electrode of the amplification element, without employing an air-core coil as the load circuit, or without employing a spiral coil or a choke coil inductance having a large current capacity and a high Q factor.

As illustrated in the lower right of FIG. 2, and FIG. 3, a capacitor Cout is coupled between the output power Pout of the transmission line transformer TLT12 and the ground potential GND, a capacitor Cin is coupled between the input power Pin of the transmission line transformer TLT12 and the ground potential GND, and a bypass capacitor Cpass is coupled between the AC ground point (a supply point of the operating voltage Vdd) of the sub line Lin and the ground potential. With these capacitors, the line length Lx of the transmission line transformer TLT12 can be set to a half of or less than a half of a quarter of the wavelength λ of the operating RF frequency.

FIG. 7 illustrates relationship between a line length Lx of the transmission line transformer TLT12 and capacitors Cin and Cout, illustrated in FIG. 3. As illustrated in the figure, the line length Lx of the transmission line transformer becomes, as known well, a quarter of the wavelength λ of the operating RF frequency, in the case where capacitors Cin and Cout are not coupled. When the operating RF frequency is 1 GHz, the line length Lx of a quarter of the wavelength λ becomes about 30 mm. On the other hand, the area of the RF power module is as small as about 5×5 mm$^2$, and it is extremely difficult to form a transmission line transformer with the line length Lx of about 30 mm inside the RF power module. When a transmission line transformer with the line length Lx of a quarter of the wavelength λ of the operating RF frequency is used, the bandwidth BW becomes wide. When capacitors Cin and Cout are coupled to both ends of the line length Lx of a transmission line transformer, the line length Lx of the transmission line transformer can be made shorter than a quarter of the wavelength λ of the operating RF frequency, in inverse proportion to the capacitance value of the capacitors Cin and Cout. When the line length Lx of the transmission line transformer becomes shorter than a quarter of the wavelength λ of the operating RF frequency, the frequency bandwidth BW at that time becomes narrower than the bandwidth in the case where a transmission line transformer with the line length Lx of a quarter of the wavelength λ of the operating RF frequency is used.

In FIG. 3, the lower layer electrodes and the upper-layer electrodes of the capacitors Cin, Cout, and Cpass are formed, respectively, by the lower layer wiring of the multilayer wiring which forms the sub line Lin of the transmission line transformer TLT12, and the upper-layer wiring of the multilayer wiring which forms the main line Lout. The capacitors Cin, Cout, and Cpass can also be formed by chip capacitors.

In the RF module according to one embodiment of the present invention illustrated in FIG. 2, the line length Lx of the other transmission line transformers TLT11, TLT21, TLT22 is set to a half of or less than a half of a quarter of the wavelength λ of the operating RF frequency, similarly to the transmission line transformer TLT12. Therefore, the transmission line transformer TLT11, TLT12, TLT21, TLT22, as the load circuits of the output electrodes of the RF amplification elements Q11, Q12, Q21, Q22, can be formed in a small occupied area over a semiconductor chip or a wiring substrate. Further, by employing the transmission line transformers TLT11, TLT12, TLT21, TLT22 with the line length Lx set to less than a half of a quarter of the wavelength λ of the operating RF frequency, it becomes possible to cover a frequency band necessary for a multiband RF communication such as a mobile-phone, and to suppress an unnecessary disturbing transmission signal.

Namely, when the first RF power amplifier HPA1 of the RF power module RF_PAM amplifies the first RF transmission input signal Pin_LB with the first frequency band of about 0.8 GHz-1.0 GHz of GSM850 and GSM900, the narrow-band frequency characteristic provided by the transmission line transformers TLT11 and TLT12 of the first RF power amplifier HPA1 becomes useful. Moreover, when the second RF power amplifier HPA2 of the RF power module RF_PAM amplifies the second RF transmission input signal Pin_HB with the second frequency band of about 1.7 GHz-2.0 GHz of DCS1800, PCS1900, and WCDMA1900, the narrow-band frequency characteristic provided by the transmission line transformers TLT21 and TLT22 of the second RF power amplifier HPA2 becomes useful.

Figure 8:
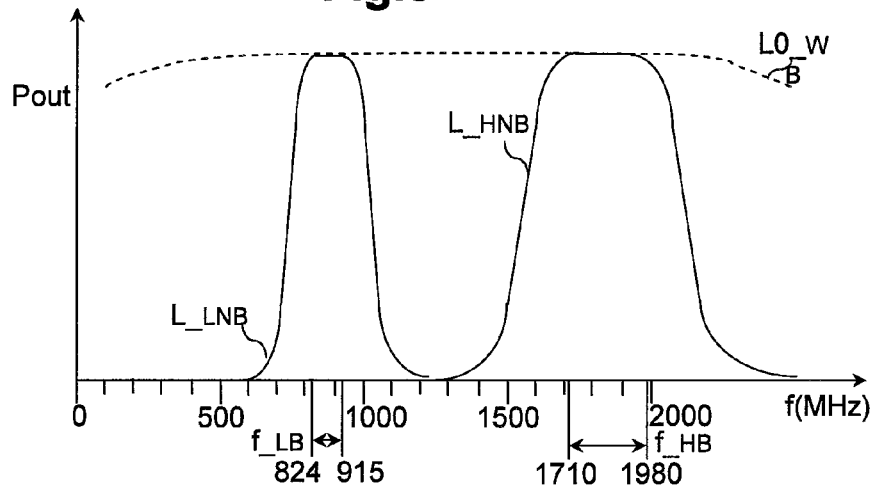
FIG. 8 is a drawing illustrating a narrow-band frequency characteristic L_LNB by a transmission line transformer of the first RF power amplifier HPA1, and a narrow-band frequency characteristic L_HNB by a transmission line transformer of the second RF power amplifier HPA2, illustrated in FIG. 2.

FIG. 8 illustrates a narrow-band frequency characteristic L_LNB by the transmission line transformers TLT11 and TLT12 of the first RF power amplifier HPA1 and a narrow-band frequency characteristic L_HNB by the transmission line transformers TLT21 and TLT22 of the second RF power amplifier HPA2, illustrated in FIG. 2. The narrow-band frequency characteristic L_LNB by the transmission line transformers TLT11 and TLT121 of the first RF power amplifier HPA1 can cover from the lowest frequency of 824 MHz of an RF transmission signal of GSM850 to the highest frequency of 915 MHz of an RF transmission signal of GSM900, and can suppress the other unnecessary disturbing transmission signals. The narrow-band frequency characteristic L_HNB by the transmission line transformers TLT21 and TLT22 of the second RF power amplifier HPA2 can cover from the lowest frequency of 1710 MHz of an RF transmission signal of DCS1800 to the highest frequency of 1980 MHz of an RF transmission signal of WCDMA1900, and can suppress the other unnecessary disturbing transmission signals. In addition, the characteristic L0_WB in FIG. 8 illustrates a wide band characteristic in the case of employing a transmission line transformer with the line length Lx of a quarter of the wavelength λ of the operating RF frequency, as the load of the amplification element of the RF power amplifier. It can be understood that the wide band characteristic L0_WB of FIG. 8 cannot suppress an unnecessary disturbing transmission signal.

Figure 9:
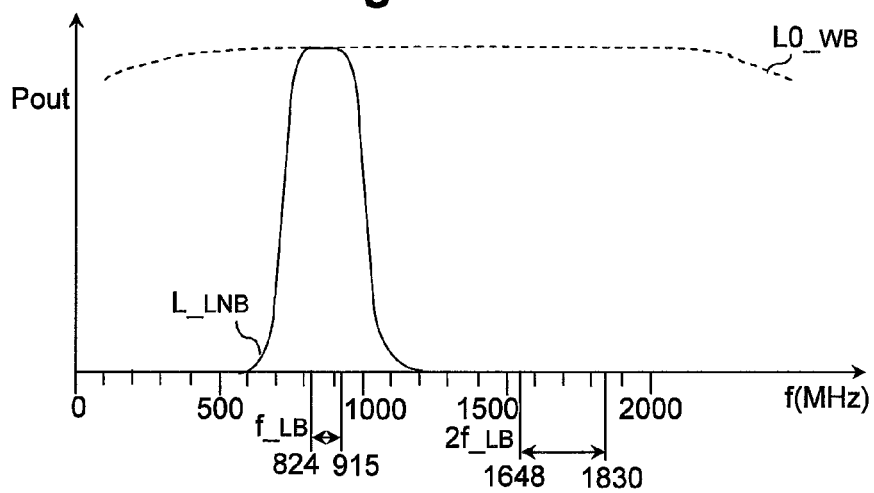
FIG. 9 is a drawing illustrating that the narrow-band frequency characteristic L_LNB by the transmission line transformer of the first RF power amplifier HPA1 illustrated in FIG. 2 covers a low band frequency f_LB from the lowest frequency of 824 MHz of an RF transmission signal of GSM850 to the highest frequency of 915 MHz of an RF transmission signal of GSM900, and suppresses a harmonic with two times higher frequency, 2f_LB.

FIG. 9 illustrates that the narrow-band frequency characteristic L_LNB by the transmission line transformers TLT11 and TLT12 of the first RF power amplifier HPA1 illustrated in FIG. 2 covers a low band frequency f_LB from the lowest frequency of 824 MHz of an RF transmission signal of GSM850 to the highest frequency of 915 MHz of an RF transmission signal of GSM900, and suppresses a harmonic of two times higher frequency 2f_LB (from 1648 MHz to 1830 MHz). Owing to the narrow-band frequency characteristic L_LNB by the transmission line transformers TLT11 and TLT12 of the first RF power amplifier HPA1, it becomes possible to suppress a harmonic of two times higher frequency of 2f_LB, without using the harmonic trap circuit HTC comprised of the inductor L101 and the capacitor C101 as illustrated in FIG. 1.

In FIG. 2, an RF transmission signal of the band of GSM850 and an RF transmission signal of the band of GSM900 are supplied to the input of the first RF power amplifier HPA1 as the first RF transmission input signal Pin_LB with the first frequency band. The frequency band of the RF transmission signal of the band of GSM850 is 824 MHz-849 MHz, and the frequency band of the RF transmission signal of the band of GSM900 is 880 MHz-915 MHz.

An RF transmission signal of the band of DCS1800 and an RF transmission signal of the band of PCS1900 are supplied to an input of the second RF power amplifier HPA2, as the second RF transmission input signal Pin_HB with the second frequency band. An RF transmission signal of the band of WCDMA1900 can also be supplied to the input of the second RF power amplifier HPA2 as the second RF transmission input signal Pin_HB. Frequency bands of an RF transmission signal of the band of DCS1800 are 1710 MHz-1785 MHz, the frequency band of the RF transmission signal of the band of PCS1900 is 1850 MHz-1910 MHz, and the frequency band of the RF transmission signal of the band of WCDMA1900 is 1920 MHz-1980 MHz.

In the first RF power amplifier HPA1, the first RF transmission input signal Pin_LB is supplied via a coupling capacitor C11, and amplified by the RF amplification element Q11 of an input amplifier 1st_Stg_LB of the multistage amplifier. An RF amplification signal of the input amplifier 1st_Stg_LB is supplied via the transmission line transformer TLT11 and the coupling capacitor C12, and amplified by the RF amplification element Q12 of the output amplifier 2nd_Stg_LB of the multistage amplifier. The first RF transmission output signal Pout_LB is obtained from the output of the RF amplification element Q12. The operation power voltage Vdd is supplied via the transmission line transformer TLT11 as the load circuit of the output electrode of the RF amplification element Q11 of the input amplifier 1st_Stg_LB, and via the transmission line transformer TLT12 as the load circuit of the RF amplification element Q12 of the output amplifier 2nd_Stg_LB. A bias voltage created by an input bias circuit 1st_B-C_LB is supplied to an input electrode of the RF amplification element Q11 of the input amplifier 1st_Stg_LB. A bias voltage created by an output bias circuit 2nd_BC_LB is supplied to an input electrode of the RF amplification element Q12 of the output amplifier 2nd_Stg_LB.

In the second RF power amplifier HPA2, the second RF transmission input signal Pin_HB is supplied via a coupling capacitance C21, and amplified by an RF amplification element Q21 of the input amplifier 1st_Stg_HB of the multistage amplifier. The RF amplification signal of the input amplifier 1stStgHB is supplied via the transmission line transformer TLT21 and the coupling capacitor C22, and amplified by the RF amplification element Q22 of the output amplifier 2nd_Stg_HB of the multistage amplifier, and the second RF transmission output signal Pout_HB is obtained from the output of the RF amplification element Q22. The operation power voltage Vdd is supplied via the transmission line transformer TLT21 as the load circuit of the output electrode of the RF amplification element Q21 of the input amplifier 1st_Stg_HB, and via the transmission line transformer TLT22 as the load circuit of the RF amplification element Q22 of the output amplifier 2nd_Stg_HB. A bias voltage created by an input bias circuit 1st_BC_HB is supplied to an input electrode of the RF amplification element Q21 of the input amplifier 1st_Stg_HB. A bias voltage created by an output bias circuit 2nd_BC_HB is supplied to an input electrode of the RF amplification element Q22 of the output amplifier 2nd_Stg_HB.

All of the N-MOS Q11 of the input amplifier 1st_Stg_LB and the N-MOS Q12 of the output amplifier 2nd_Stg_LB of the multistage amplifier of the first RF power amplifier HPA1, and the N-MOS Q21 of the input amplifier 1st_Stg_HB and the N-MOS Q22 of the output amplifier 2nd_Stg_HB of the multistage amplifier of the second RF power amplifier HPA2, are an N channel power MOS transistor called LDMOS (Lateral Diffused MOS) which is suitable for RF amplification. However, they can be replaced by the other RF power amplification element, such as HBT (hetero-bipolar transistor).

<<Other Transmission Line Transformers>>

FIG. 4 illustrates that the transmission line transformer TLT12 with a main line Lout and a sub line Lin, illustrated in the lower right of FIG. 2, is formed by one-layer wiring over a semiconductor chip or a wiring substrate. The sub line Lin of the transmission line transformer TLT12 is formed by one-layer wiring, and the main line Lout of the transmission line transformer TLT12 is also formed by one-layer wiring. The sub line Lin formed by one-layer wiring and the main line Lout formed by one-layer wiring are electrically insulated by a gap in between. The operating voltage Vdd can be supplied to one end Lin(B) of the sub line Lin formed by one-layer wiring by wiring of a second layer, for example. The input power Pin from the output electrode of the amplification element Q12 can be supplied to the other end Lin (A) of the sub line Lin. The other end Lin(A) of the sub line Lin is coupled to the one end In(A) of the main line Lout of the transmission line transformer TLT12. The output power Pout of the amplification element Q12 can be generated from the other end Out (B) of the main line Lout, by the impedance conversion from the sub line Lin to the main line Lout of the transmission line transformer TLT12. Therefore, it becomes possible to take out an RF amplification voltage signal from the output electrode of the amplification element, without employing an air-core coil as the load circuit, or without employing a spiral coil or a choke coil inductance having a large current capacity and a high Q factor.

Figure 6:
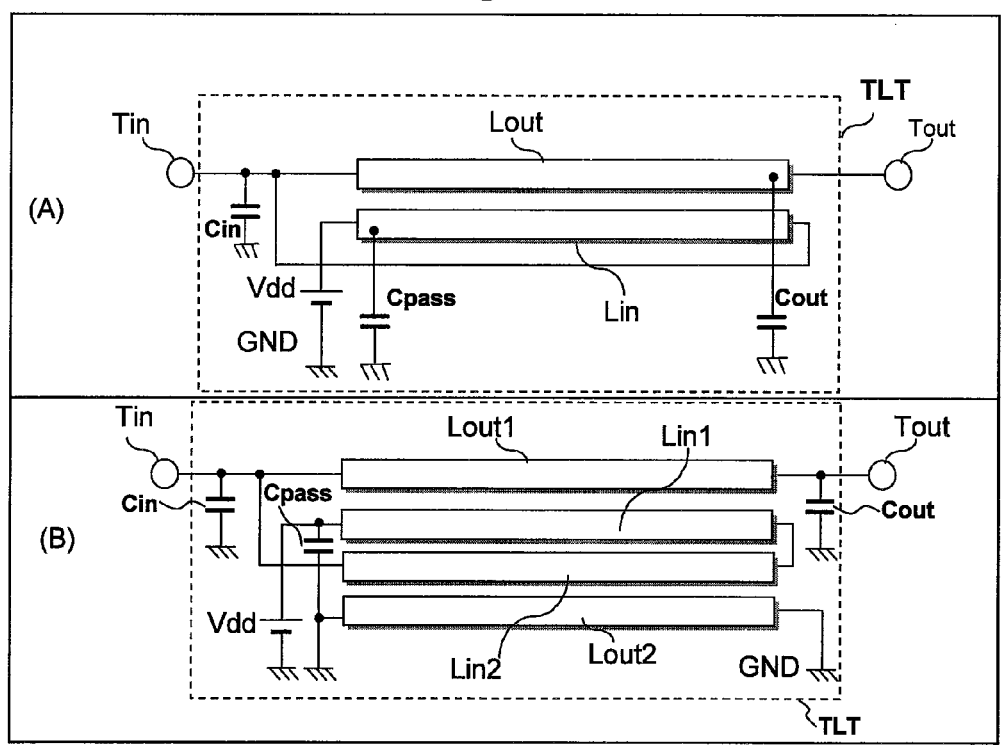
FIG. 6 is a drawing illustrating various types of transmission line transformers usable as a transmission line transformer of the load element of the output electrode of the RF amplification element illustrated in FIG. 2.

FIG. 6 illustrates various types of transmission line transformers usable as the transmission line transformers TLT11, TLT12, TLT21, TLT22 of the load elements of the output electrodes of the RF amplification elements Q11, Q12, Q21, Q22, illustrated in FIG. 2.

A transmission line transformer illustrated in FIG. 6 (A) is a type of the transmission line transformer explained in FIG. 2, FIG. 3, and FIG. 4, and is analogous to an unbalanced Ruthroff-type transmission line transformer. A transmission line transformer illustrated in FIG. 6 (B) is analogous to an unbalanced Guanella-type transmission line transformer. Any type of the transmission line transformers can be formed by multilayer wiring over a semiconductor chip or a wiring substrate. Therefore, it becomes possible to take out an RF amplification voltage signal from an output electrode of an amplification element, without employing an air-core coil as the load circuit, or without employing a spiral coil or a choke coil inductance having a large current capacity and a high Q factor.

<<Specific Constitution of RF Power Module>>

FIG. 10 illustrates specific constitution of an RF power module RF_PAM according to further another embodiment of the present invention.

As illustrated in the figure, the RF power module RF_PAM according to further another embodiment of the present invention is incorporated in one package. An N-channel LDMOS as an RF amplification element, and an internal circuit for a power control, a bias control, etc. are formed over one chip of a silicon semiconductor integrated circuit Si IC. At the lower part inside the chip of the silicon semiconductor integrated circuit Si IC, a first RF power amplifier HPA1 for transmitting GSM850 and GSM900 is arranged. At the upper part inside the chip, a second RF power amplifier HPA2 for transmitting DCS1800, PCS1900, and WCDMA1900 is arranged. At the middle part inside the chip, a power detector DET, a voltage regulator Vreg, and a mode switch control circuit Md_Sw to which a mode signal MODE is supplied are arranged. The silicon semiconductor integrated circuit Si IC is arranged over a wiring substrate of the RF power module RF_PAM. Also arranged over the present wiring substrate are transmission line transformers TLT11, TLT12, TLT21, TLT22, as load elements, many passive elements of capacitive elements C12, C22, and others, two power couplers PCPL_LB, PCPL_HB, two strip lines OUT_SL_LB, OUT_SL_HB, and others. As described above, the transmission line transformer TLT11, TLT12, TLT21, TLT22 are formed using multilayer wiring over a wiring substrate. The coupler PCPL_LB detects the transmission output level of the first RF power amplifier HPA1, and the coupler PCPL_HB detects the transmission output level of the second RF power amplifier HPA2. By electromagnetic coupling between the Y-shaped output combining strip line OUT_SL_LB, formed using the lower layer wiring of the multilayer wiring, and the coupler PCPL_LB formed using the upper layer wiring of the multilayer wiring, the coupler PCPL_LB detects the transmission output level of the first RF power amplifier HPA1. One end of the coupler PCPL_LB is coupled to the ground voltage GND via a terminator R34, and the transmission output level of the other end of the coupler PCPL_LB is supplied to the power detector DET. Change of the transmission output level turns into an output change of the power detector DET and the voltage regulator Vreg. APC control of the first RF power amplifier HPA1 is performed by the bias voltage change of the input bias circuit 1st_BC_LB and the output bias circuit 2nd_BC_LB. By electromagnetic coupling between the Y-shaped output combining strip line OUT_SL_HB, formed using the lower layer wiring of the multilayer wiring, and the coupler PCPL_HB formed using the upper layer wiring of the multilayer wiring, the coupler PCPL_LB detects the transmission output level of the second RF power amplifier HPA2. One end of the coupler PCPL_HB is coupled to the ground voltage GND via a terminator R35, and the transmission output level of the other end of the coupler PCPL_HB is supplied to the power detector DET. Change of the transmission output level turns into an output change of the power detector DET and the voltage regulator Vreg. APC control of the second RF power amplifier HPA2 is performed by the bias voltage change of the input bias circuit 1st_BC_HB and the output bias circuit 2nd_BC_HB.

The output amplifier 2nd_Stg_LB of the first RF power amplifier HPA1 is comprised of two amplifiers in parallel connection. Similarly, the output amplifier 2nd_Stg_HB of the second RF power amplifier HPA2 is comprised of two amplifiers in parallel connection. Two inputs of the two output amplifiers 2nd_Stg_LB in parallel connection of the first RF power amplifier HPA1 are driven in parallel by the output of the input amplifier 1st_Stg_LB. Similarly, two inputs of the two output amplifiers 2nd_Stg_HB in parallel connection of the second RF power amplifier HPA2 are driven in parallel by the output of the input amplifier 1st_Stg_HB. Two outputs of the two output amplifiers 2nd_Stg_LB in parallel connection of the first RF power amplifier HPA1 are supplied to two inputs of the Y-shaped output combining strip line OUT_SL_LB. The first RF transmission output signal Pout_LB of either of GSM850 and GSM900 is outputted from the output of the Y-shaped output combining strip line OUT_SL_LB. Similarly, two outputs of the two output amplifiers 2nd_Stg_HB in parallel connection of the second RF power amplifier HPA2 are supplied to two inputs of the Y-shaped output combining strip line OUT_SL_HB. The second RF transmission output signal Pout_HB of one of DCS1800, PCS1900, and WCDMA1900 is outputted from the output of the Y-shaped output combining strip line OUT_SL_HB. A power detection signal VDET of the power detector DET is outputted from the right-hand side of the RF power module RF_PAM. From the left-hand side of the RF power module RF_PAM, the first RF transmission input signal Pin_LB of either of GSM850 and GSM900, the second RF transmission input signal Pin_HB of one of DCS1800, PCS1900, and WCDMA1900, and a mode signal MODE are supplied. The two output amplifiers 2nd_Stg_LB in parallel connection and the two output amplifiers 2nd_Stg_HB in parallel connection are comprised of so-called DD-CIMA-type amplifiers. DD-CIMA stands for Divided-Device and Collectively Impedance-Matched Amplifier.

Figure 11:
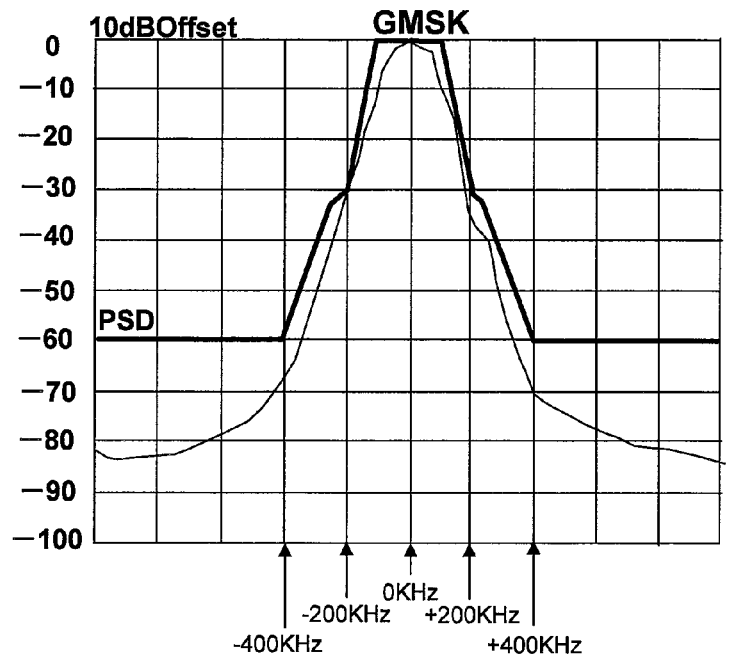
FIG. 11 is a drawing illustrating a frequency spectrum of an RF transmission signal of a mobile phone terminal apparatus specified by the standard of GMSK.

The transmission line transformers TLT11, TLT12, TLT21, TLT22 employ at least one of an input capacitor and an output capacitor of the main line as described above; consequently, the line length Lx of the transmission line transformer is set to a half of or less than a half of a quarter of the wavelength λ of the operating RF frequency. Therefore, the first RF power amplifier HPA1 which outputs the first RF transmission output signal Pout_LB of either GSM850 and GSM900 is designed to have a narrow-band frequency characteristic, and the second RF power amplifier HPA2 which outputs the second RF transmission output signal Pout_HB of one of DCS1800, PCS1900, and WCDMA1900 is designed to have a narrow-band frequency characteristic. FIG. 11 illustrates a frequency spectrum of an RF transmission signal of a mobile phone terminal apparatus specified by the standard of GMSK, where a thick solid line PSD is the level specified by the standard of GMSK. The standard of GMSK (Gaussian Minimum-shift Keying) specifies an adjacent-channel disturbing signal level to be satisfied in GSM850, GSM900, DCS1800, and PCS1900 which employ phase modulation for communication. That is, the standard of GMSK specifies that the magnitude of attenuation at ±200 kHz near the center frequency (RF transmission frequency) is less than −30 dBm, and the magnitude of attenuation at ±400 kHz near the center frequency (RF transmission frequency) is less than −60 dBm. As demonstrated by a thin solid line, the narrow-band frequency characteristic of the first RF power amplifier HPA1 and the second RF power amplifier HPA2, described above, is useful in satisfying the standard of GMSK.

<<Low-Noise Amplifier of RF IC>>

FIG. 12 illustrates constitution of an integrated circuit for processing RF transmitting and receiving analog signals (RF IC) according to yet another embodiment of the present invention.

As illustrated in the figure, the RF IC according to yet another embodiment of the present invention comprises a low-noise amplifier LNA, a receive mixer MIX, and an RF voltage controlled oscillator for reception RxVCO inside a silicon semiconductor chip, for example. The low-noise amplifier LNA comprises an amplification element Q1 which amplifies an RF reception signal received by an antenna of a wireless radio communication terminal, and a transmission line transformer TLT coupled to an output electrode of the amplification element Q1. The transmission line transformer TLT comprises a main line Lout arranged between an input Pin and an output Pout, and a sub line Lin arranged between an AC ground point and one of the input Pin and the output Pout and coupled to the main line Lout. The input Pin of the main line Lout of the transmission line transformer TLT is coupled to the output electrode of the amplification element Q1 via another amplification element Q2. By applying an operating voltage Vdd different from the ground voltage level GND to the AC ground point, the operating voltage Vdd is supplied to the output electrode of the amplification element Q1 via the sub line Lin from the AC ground point.

The transmission line transformer TLT coupled to the output electrode of the amplification element Q1 of the low-noise amplifier LNA of the RF IC of FIG. 12 can be formed by multilayer wiring over a semiconductor chip, with the structure illustrated in FIG. 3. Between the sub line Lin and the main line Lout of the transmission line transformer TLT, a transmission line having a certain characteristic impedance is formed, and energy is transferred from the sub line Lin to the main line Lout of the transmission line transformer TLT by a transmission line mode. Therefore, it becomes possible to take out an RF amplification voltage signal from the output electrode of the amplification element, without employing an air-core coil as the load circuit, or without employing a spiral coil or a choke coil inductance having a large current capacity and a high Q factor. A capacitor Cout is coupled between the output power Pout of the transmission line transformer TLT and the ground potential GND, a capacitor Cin is coupled between the input Pin of the transmission line transformer TLT and the ground potential GND, and a capacitor Cpass is coupled between the AC ground point (a supply point of the operating voltage Vdd) of the sub line Lin and the ground potential. With these capacitors, the line length Lx of the transmission line transformer TLT can be set to a half of or less than a half of a quarter of the wavelength λ of the operating RF frequency. As a result, it becomes possible to form the transmission line transformer TLT with a small occupied area over a semiconductor chip.

In the RF IC illustrated in FIG. 12, an RF reception signal VIN of one of GSM850, GSM900, DCS1800, PCS1900, and WCDMA1900, received by an antenna of a wireless radio communication terminal, is supplied to a gate of the source-grounded N-channel MOS transistor Q1 via a coupling capacitor CIN. An N-channel MOS transistor Q0 for bias is coupled to the gate of the N-channel MOS transistor Q1 via resistors R0 and R1, and a bias current source Io is coupled between the N-channel MOS transistor Q0 for bias, and the operating voltage Vdd. A drain of the source-grounded N-channel MOS transistor Q1 is coupled to the transmission line transformer TLT via a source-drain path of a gate-grounded N-channel MOS transistor Q2 coupled in cascade, of which the gate is supplied with a bias voltage Vb.

An RF received and amplified signal generated by the transmission line transformer TLT of the low-noise amplifier LNA is supplied to one input terminal of two mixers IMIX and QMIX of the receive mixer MIX. An RF local signal for reception is generated by the RF voltage controlled oscillator for reception RxVCO. The RF local signal for reception is supplied to the other input terminal of the mixer I_MIX, and a 90-degree phase-shifted RF local signal from a 90-degree phase shifter)(90° is supplied to the other input terminal of the mixer QMIX. Orthogonal baseband demodulation signals I, Q are generated from the output of the two mixers I_MIX, Q_MIX, and supplied to a baseband signal processing block such as a baseband LSI.

In the above, the invention accomplished by the present inventors has been specifically explained based on the embodiments. It cannot be overemphasized that the present invention is not restricted to the embodiments, and it can be changed variously in the range which does not deviate from the gist.

For example, in FIG. 10, it is possible to alternatively employ a current sensing detector, in addition to the power couplers PCPL_LB, PCPL_HB for detecting the transmission output power level which detects the transmission power of the RF power amplifier. This current sensing detector has a detection amplifying element coupled in parallel to a last-stage power amplification element of the RF power amplifier, and a small detection DC-AC operating current, which is proportional to the DC-AC operating current of the last-stage power amplification element, flows through the detection amplifying element.

As the power device of the RF power amplifier, it is also possible to employ an HBT (Hetero Bipolar Transistor), such as GaAs, InGaAs, and SiGe, and a GaAs system FET, in addition to employing a power MOSFET of LD (Lateral Diffused) structure by silicon.

Furthermore, the shape of the main line Lout and the sub line Lin of the transmission line transformer TLT is not restricted to a circular shape in FIG. 3 and FIG. 4. It is also preferable to employ, for example, a shape of polygons, such as a quadrangle.

INDUSTRIAL APPLICABILITY

Although the present invention has been mainly described about a mobile-phone terminal, the present invention is not restricted to the mobile-phone terminal, and can be widely applied to a mobile-phone base station, an in-vehicle device, home electric appliances, and other equipment and devices using wireless radio communication.

What is claimed is:

1. An RF amplification device comprising:
an amplification element operable to amplify a radio frequency input signal in wireless radio communication; and
a transmission line transformer coupled to at least one electrode of an input electrode and an output electrode of the amplification element,
wherein the transmission line transformer comprises:
a main line arranged between an input and an output; and
a sub line arranged between an AC ground point and one of the input and the output, and coupled to the main line,
wherein one of the input and the output of the main line of the transmission line transformer is coupled to the one electrode of the amplification element, and
wherein an operating voltage different from a ground voltage level is applied to the AC ground point, and the operating voltage is supplied to the one electrode of the amplification element from the AC ground point via the sub line.

2. The RF amplification device according to claim 1,
wherein the line length of the transmission line transformer is set to a half of or less than a half of a quarter of the wavelength of an operating RF frequency by providing a capacitor between the input of the transmission line transformer and a ground potential, between the output of the transmission line transformer and the ground potential, or between the AC ground point of the sub line of the transmission line transformer and the ground potential.

3. The RF amplification device according to claim 2,
wherein, by setting the line length of the transmission line transformer to a half of or less than a half of a quarter of the wavelength of the operating RF frequency, a frequency characteristic of the RF amplification device is set to have a narrower band than a band characteristic in the case of setting the line length of the transmission line transformer to a quarter of the wavelength of the operating RF frequency.

4. The RF amplification device according to claim 2,
wherein the main line and the sub line of the transmission line transformer are formed by a wiring layer arranged over a semiconductor chip or a wiring circuit substrate.

5. The RF amplification device according to claim 4,
wherein the main line and the sub line of the transmission line transformer and one electrode and the other electrode of the capacitor are formed by multi wiring layers arranged over the semiconductor chip or the wiring circuit substrate.

6. The RF amplification device according to claim 2,
wherein the amplification element generates an RF transmission signal to be transmitted from an antenna of a wireless radio communication terminal, and the RF amplification device is a power amplifier.

7. The RF amplification device according to claim 2,
wherein the amplification element amplifies an RF reception signal received by an antenna of a wireless radio communication terminal, and the RF amplification device is a low-noise amplifier.

8. An RF amplification device comprising:
a first power amplifier operable to amplify a first RF transmission input signal having a first frequency band; and a second power amplifier operable to amplify a second RF transmission input signal having a second frequency band with a higher frequency than the first frequency band, wherein the first power amplifier is comprised of a first multistage amplifier comprising at least a first input amplifier and a first output amplifier, wherein the second power amplifier is comprised of a second multistage amplifier comprising at least a second input amplifier and a second output amplifier, wherein the first input amplifier of the first power amplifier comprises a first input amplification element and a first input transmission line transformer coupled to an output electrode of the first input amplification element, wherein the first output amplifier of the first power amplifier comprises a first output amplification element and a first output transmission line transformer coupled to an output electrode of the first output amplification element, wherein the second input amplifier of the second power amplifier comprises a second input amplification element and a second input transmission line transformer coupled to an output electrode of the second input amplification element, wherein the second output amplifier of the second power amplifier comprises a second output amplification element and a second output transmission line transformer coupled to an output electrode of the second output amplification element, wherein each of the first input transmission line transformer, the first output transmission line transformer, the second input transmission line transformer, and the second output transmission line transformer comprises a main line arranged between an input and an output, and a sub line arranged between an AC ground point and one of the input and the output and coupled to the main line, and wherein the input of the main line of the each transmission line transformer is coupled to the output electrode of the corresponding amplification element, an operating voltage different from a ground voltage level is applied to the AC ground point, and the operating voltage is supplied to the output electrode of the amplification element from the AC ground point via the sub line.

9. The RF amplification device according to claim 8,
wherein each of the first input transmission line transformer, the first output transmission line transformer, the second input transmission line transformer, and the second output transmission line transformer is a multistage-coupled transmission line transformer.

10. The RF amplification device according to claim 8,
wherein the line length of each transmission line transformer of the first input transmission line transformer, the first output transmission line transformer, the second input transmission line transformer, and the second output transmission line transformer is set to a half of or less than a half of a quarter of the wavelength of an operating RF frequency, by providing a capacitor between the input of the each transmission line transformer and the ground potential, between the output of the each transmission line transformer and the ground potential, or between the AC ground point of the sub line of the each transmission line transformer and the ground potential.

11. The RF amplification device according to claim 10,
wherein, by setting the line length of the each transmission line transformer to a half of or less than a half of a quarter of the wavelength of the operating RF frequency, a frequency characteristic of the RF amplification device is set to have a narrower band than a band characteristic in the case of setting the line length of the each transmission line transformer to a quarter of the wavelength of the operating RF frequency.

12. The RF amplification device according to claim 8,
wherein the main line and the sub line of each of the first input transmission line transformer, the first output transmission line transformer, the second input transmission line transformer, and the second output transmission line transformer are formed by a wiring layer arranged over a semiconductor chip or a wiring circuit substrate.

13. The RF amplification device according to claim 8,
wherein the main line and the sub line of each of the first input transmission line transformer, the first output transmission line transformer, the second input transmission line transformer, and the second output transmission line transformer, and one electrode and the other electrode of the capacitor are formed by multi wiring layers arranged over the semiconductor chip or the wiring circuit substrate.

14. The RF amplification device according to claim 8,
wherein the first input amplification element and the first output amplification element of the first power amplifier and the second input amplification element and the second output amplification element of the second power amplifier are a field-effect transistor.

15. The RF amplification device according to claim 14,
wherein the field-effect transistor is an LDMOS.

16. The RF amplification device according to claim 8,
wherein the first input amplification element and the first output amplification element of the first power amplifier and the second input amplification element and the second output amplification element of the second power amplifier are a bipolar transistor.

17. The RF amplification device according to claim 16,
wherein the bipolar transistor is a heterojunction type.

18. The RF amplification device according to claim 8,
wherein the first power amplifier, the second power amplifier, and a power detector to detect a transmission output level of the first power amplifier and the second power amplifier are mounted in a package of an RF power module.

19. The RF amplification device according to claim 18,
wherein the first RF transmission input signal is in a frequency band of at least one of GSM850 and GSM900, and
wherein the second RF transmission input signal is in a frequency band of at least one of DCS1800, PCS1900, and W-CDMA.

20. The RF amplification device according to claim 19,
wherein the first output amplifier of the first power amplifier is comprised of a plurality of first amplifiers coupled in parallel, and the second output amplifier of the second power amplifier is comprised of a plurality of second amplifiers coupled in parallel.

21. An RF amplification device comprising:
an amplification element operable to amplify a radio frequency input signal of a wireless radio communication; and
a transmission line transformer coupled to an electrode of at least one of an input electrode and an output electrode of the amplification element,
wherein the transmission line transformer comprises:
a former-stage transmission line transformer comprising a first main line arranged between a first input and a first output, and a first sub line arranged between a first AC ground point and one of the first input and the first output and coupled to the first main line; and a latter-stage transmission line transformer comprising a second main line arranged between a second input and a second output, and a second sub line arranged between a second AC ground point and one of the second input and the second output and coupled to the second main line, wherein the first output of the first main line of the former-stage transmission line transformer of the transmission line transformer is coupled to the second input of the second main line of the latter-stage transmission line transformer, wherein one of the first input of the first main line of the former-stage transmission line transformer of the transmission line transformer and the second output of the second main line of the latter-stage transmission line transformer of the transmission line transformer is coupled to the one electrode of the amplification element, and wherein an operating voltage different from a ground voltage level is applied to one of the first AC ground point and the second AC ground point, and the operating voltage is supplied to the one electrode of the amplification element.

22. The RF amplification device according to claim 21, wherein the line length of each transmission line transformer of the former-stage transmission line transformer and the latter-stage transmission line transformer of the transmission line transformer is set to a half of or less than a half of a quarter of the wavelength of an operating RF frequency, by providing a capacitor between the input of the each transmission line transformer and the ground potential, between the output of the each transmission line transformer and the ground potential, or between the AC ground point of the sub line of the each transmission line transformer and the ground potential.

23. The RF amplification device according to claim 22, wherein, by setting the line length of the each transmission line transformer to a half of or less than a half of a quarter of the wavelength of the operating RF frequency, a frequency characteristic of the RF amplification device is set to have a narrower band than a band characteristic in the case of setting the line length of the each transmission line transformer to a quarter of the wavelength of the operating RF frequency.

24. The RF amplification device according to claim 22, wherein the main line and the sub line of the each transmission line transformer are formed by a wiring layer arranged over a semiconductor chip or a wiring circuit substrate.

25. The RF amplification device according to claim 24, wherein the main line and the sub line of the each transmission line transformer, and one electrode and the other electrode of the capacitor are formed by multi wiring layers arranged over the semiconductor chip or the wiring circuit substrate.

26. The RF amplification device according to claim 22, wherein the amplification element generates an RF transmission signal to be transmitted from an antenna of a wireless radio communication terminal, and the RF amplification device is a power amplifier.

27. The RF amplification device according to claim 22, wherein the amplification element amplifies an RF reception signal received by an antenna of a wireless radio communication terminal, and the RF amplification device is a low-noise amplifier.

* * * * *